United States Patent
Ishizu et al.

(10) Patent No.: US 8,933,408 B2
(45) Date of Patent: Jan. 13, 2015

(54) COLQUIRIITE-TYPE CRYSTAL, SCINTILLATOR FOR NEUTRON DETECTION AND NEUTRON DETECTOR

(75) Inventors: Sumito Ishizu, Shunan (JP); Kentaro Fukuda, Shunan (JP); Noriaki Kawaguchi, Shunan (JP); Akira Yoshikawa, Sendai (JP); Takayuki Yanagida, Sendai (JP); Yui Yokota, Sendai (JP); Yutaka Fujimoto, Sendai (JP)

(73) Assignees: Tokuyama Corporation, Shunan-shi, Yamaguchi; Tohoku University, Sendai-shi, Miyagi ( * ) Notice: Subject to any disclaimer, the term of this patent is extended or adjusted under 35 U.S.C. 154(b) by 76 days.

(21) Appl. No.: 13/820,175
(22) PCT Filed: Nov. 1, 2011
(86) PCT No.: PCT/JP2011/075196
§ 371 (c)(1),
(2), (4) Date: Mar. 1, 2013
(87) PCT Pub. No.: WO2012/060381
PCT Pub. Date: May 10, 2012

(65) Prior Publication Data
US 2013/0161519 A1   Jun. 27, 2013

(30) Foreign Application Priority Data
Nov. 2, 2010   (JP) ................ 2010-246218

(51) Int. Cl.
G01T 1/20   (2006.01)
G01T 3/06   (2006.01)
(Continued)

(52) U.S. Cl.
CPC .............. *G01T 3/06* (2013.01); *C09K 11/7721* (2013.01); *C30B 15/00* (2013.01); *C30B 15/08* (2013.01); *C30B 29/12* (2013.01)
USPC ..................................... 250/361 R

(58) Field of Classification Search
CPC ........................................... G01T 1/20
USPC ..................................... 250/361 R
See application file for complete search history.

(56) References Cited

U.S. PATENT DOCUMENTS 8,044,367 B2   10/2011 Yoshikawa et al.
2006/0033025 A1   2/2006 Ichinose et al.

FOREIGN PATENT DOCUMENTS

JP   2000-351695 A   12/2000
JP   2002-60299 A   2/2002
(Continued)

OTHER PUBLICATIONS
A. Bessiere et al.; New Thermal Neutron Scintillators . . . ; IEEE Transactions on Nuclear Science; vol. 51; No. 5; Oct. 1, 2004; pp. 2970-02972.
(Continued)

*Primary Examiner* — David Porta
*Assistant Examiner* — Hugh H Maupin
(74) *Attorney, Agent, or Firm* — Birch, Stewart, Kolasch & Birch, LLP

(57) ABSTRACT

[Problems to be Solved] A colquiriite-type crystal preferred for a scintillator for neutron detection, which has high sensitivity to neutron and which is reduced in background noise attributed to γ rays; a scintillator for neutron detection which comprises this crystal; and a neutron detector are provided. [Means to Solve the Problems] A colquiriite-type crystal represented by the chemical formula $LiM^1M^2X_6$, such as $LiCaAlF_6$, containing Na and Ce, for example, the colquiriite-type crystal containing at least one alkali metal element selected from the group consisting of Na, K, Rb and Cs, and a lanthanoid element selected from the group consisting of Ce, Pr and Nd, and having an isotopic ratio of $^6Li$ of 20 mol % or more, preferably 50 mol % or more; a scintillator for neutron detection comprising the colquiriite-type crystal; and a neutron detector.

5 Claims, 4 Drawing Sheets

(51) Int. Cl.
  *C09K 11/77* (2006.01)
  *C30B 15/00* (2006.01)
  *C30B 15/08* (2006.01)
  *C30B 29/12* (2006.01)

(56) References Cited

FOREIGN PATENT DOCUMENTS

| JP | 2007-45869 A | 2/2007 |
|---|---|---|
| WO | WO 2004/086089 A1 | 10/2004 |
| WO | WO 2009/119378 A1 | 10/2009 |
| WO | WO 2011/115179 A1 | 9/2011 |

OTHER PUBLICATIONS

Akira Yoshikawa et al.; Crystal growth, optical properties and neutron responses of Ce3+ . . . ; 2008 IEEE Nuclear Science Symposium Conference Record; Oct. 1, 2008; pp. 1212-1214.
Akira Yoshikawa et al.; Single Crystal Growth, Optical Properties and Neutron Response . . . ; IEEE Transactions on Nuclear Science; vol. 56; No. 6; Dec. 1, 2009; pp. 3796-3799.
Athanassios G. Kontos et al.; An ESR study of a . . . ; SPIE Proceedings; Nov. 6, 2003; pp. 109-113.
Extended European Search Report dated Sep. 8, 2014, issued in corresponding European Patent Appliction No. 11838031.0.
Vida K. Castillo et al.; Material and laser characterization of . . . ; SPIE proceedings; Jun. 13, 2003; pp. 22-34.
Y. Yokota et al.; Effects of charge compensation by Na + co-doping for Ce3+ doped . . . ; Nuclear Science Symposium Conference Record; Oct. 30, 2010; pp. 223-225.
Yuki Furuya et al.; Crystal growth and scintillation properties of lithium potassium yttrium complex fluoride; Nuclear Science Symposium Conference; Oct. 30, 2010; pp. 226-229.
International Search Report issued in PCT/JP2011/075196, mailed on Dec. 13, 2011.
Knitel et al., "LiBaF3, a thermal neutron scintillator with optimal n-gamma discrimination," Nuclear Instruments and Methods in Physics Research A 374, 1996, pp. 197-201.

COLQUIRIITE-TYPE CRYSTAL, SCINTILLATOR FOR NEUTRON DETECTION AND NEUTRON DETECTOR

TECHNICAL FIELD

This invention relates to a colquiriite-type crystal, and a scintillator for neutron detection which comprises the colquiriite-type crystal. More specifically, the invention relates to a colquiriite-type crystal containing an alkali metal element and a lanthanoid element and an isotopic ratio of $^6$Li of 20% or more.

BACKGROUND ART

Scintillators are substances which, when hit by radiation such as alpha rays, beta rays, gamma rays, X rays, or neutron, absorb the radiation to emit fluorescence. The scintillator is combined with a photodetector, such as a photomultiplier tube, and such a combination is used for detection of radiation. The combination has wide varieties of application fields, including medical fields such as tomography, industrial fields such as nondestructive inspection, security fields such as inspection of personal belongings, and academic fields such as high energy physics.

Among scintillators are various types of scintillators according to the type of radiation and the purpose of use. Concrete examples include inorganic crystals such as bismuth germanium oxide ($Bi_4Ge_3O_{12}$) and cerium-containing gadolinium silicon oxide ($Gd_2SiO_5$:Ce), organic crystals such as anthracene, polymers such as polystyrene or polyvinyltoluene incorporating an organic fluorescent substance, liquid scintillators, and gaseous scintillators.

Conventional neutron detection has mainly employed a neutron detector using a $^3$He gas. Owing to price hikes of a rare $^3$He gas, however, switching to alternative technologies is desired. A neutron detector using a solid scintillator for detecting neutrons is one of promising candidates for the alternative technologies.

As typical properties demanded of a scintillator, a high amount of luminescence, high stopping power for radiation, fast decay of fluorescence, etc. are named. Particularly in the scintillator whose object of detection is neutron, a radiative capture reaction occurs between neutrons and an absorbing substance contained in materials for the detector or the object to be tested, such as Fe (iron), Pb (lead), Cd (cadmium), C (carbon) or N (nitrogen). As a result, gamma rays are prone to occur, so that the scintillator needs to have the ability to discriminate between gamma rays and the neutron.

The solid scintillator so far used for neutron detection has been a $^6$Li glass scintillator as a material lacking deliquescent properties and making a rapid response. However, its manufacturing process has been complicated and thus expensive, and there has been a limit to its upsizing. A scintillator for neutron detection, comprising a fluoride crystal, on the other hand, is advantageous in that an upsized scintillator can be produced at a low cost. For example, a scintillator comprising a $LiBaF_3$ crystal has been proposed. However, this scintillator has high sensitivity to γ rays, and produces a great background noise attributed to γ rays. Thus, there has been need to take a special measure in using it as a scintillator for neutron detection (see Non-Patent Document 1).

In the light of the above problems, the inventors of the present invention irradiated various fluoride crystals with neutron, and evaluated their properties as scintillators for neutron detection. As a result, they found that an $LiCaAlF_6$ crystal containing a lanthanoid element exhibited particularly satisfactory characteristics as a scintillator for neutron detection by incorporating therein 1.1 to 20 atoms of $^6$Li per unit volume ($nm^3$) (see Patent Document 1).

The $LiCaAlF_6$ crystal containing the lanthanoid element has high detection efficiency for neutron and has high ability to discriminate between neutron and gamma rays. For use as a solid scintillator for neutron detection, intended for replacing the aforementioned neutron detector using a $^3$He gas, however, this $LiCaAlF_6$ crystal has left room for improvement in the discrimination ability. Regrettably, there have been no generally accepted theories for predicting the discrimination ability. Hence, it has been difficult to predict beforehand whether or not various materials have the ability to discriminate between neutron and gamma rays.

PRIOR ART DOCUMENTS

Patent Documents

Patent Document 1: WO 2009/119378

Non-Patent Documents

Non-Patent Document 1: C. W. E. van Eijk et al., "LiBaF$_3$, a thermal neutron scintillator with optimal n-γ discrimination", Nuclear Instruments and Methods in Physics Research A 374 (1996) 197-201

SUMMARY OF THE INVENTION

Problems to be Solved by the Invention

It is an object of the present invention to provide a colquiriite-type crystal preferred for a scintillator for neutron detection, which has high sensitivity to neutron and which is reduced in background noise attributed to γ rays; and a scintillator for neutron detection which comprises this crystal.

Means for Solving the Problems

The present inventors have prepared various colquiriite-type crystals having the same crystal structure as that of the aforementioned $LiCaAlF_6$ crystal, and have evaluated their detection efficiency for neutron and their ability to discriminate between neutron and γ rays when using these colquiriite-type crystals as scintillators for neutron detection. As a result, the inventors have found that a colquiriite-type crystal with an increased isotopic ratio of $^6$Li can gain satisfactory discrimination ability by incorporating a specific alkali metal element and a specific lanthanoid element into such a colquiriite-type crystal. This finding has led the inventors to accomplish the present invention.

According to the present invention, there is provided a colquiriite-type crystal represented by the chemical formula $LiM^1M^2X_6$ where $M^1$ represents at least one alkaline earth metal element selected from the group consisting of Mg, Ca, Sr and Ba, $M^2$ represents at least one metal element selected from the group consisting of Al, Ga and Sc, and X represents at least one halogen element selected from the group consisting of F, Cl, Br and I, wherein the colquiriite-type crystal contains at least one alkali metal element selected from the group consisting of Na, K, Rb and Cs, and at least one lanthanoid element selected from the group consisting of Ce, Pr and Nd, and the isotopic ratio of $^6$Li is 20% or more.

In the invention of the colquiriite-type crystal mentioned above, it is preferred that 1) the contents of the alkali metal element and the lanthanoid element be 0.001 to 10 mol % and 0.01 to 0.5 mol %, respectively, with respect to the colquiriite-type crystal;

2) the colquiriite-type crystal be represented by the chemical formula $LiCa_{1-x}Sr_xAlF_6$ where x denotes a number of 0 to 1; and 3) $M^1$ be Ca, $M^2$ be Al, the alkali metal element be Na, the lanthanoid element be Ce, and the isotopic ratio of $^6Li$ be 50% or more.

According to the present invention, there are also provided a scintillator for neutron detection which comprises the colquiriite-type crystal, and a neutron detector characterized by having the scintillator and a photodetector.

Effects of the Invention

The colquiriite-type crystal of the present invention can be used preferably as a scintillator for neutron detection which is reduced in background noise attributed to γ rays as compared with conventional scintillators. The above scintillator is combined with a photodetector, and thereby can be used preferably as a neutron detector for use in applications such as the determination of whether neutron is present or absent in the environment. Since the colquiriite-type crystal of the present invention is excellent in affording the amount of luminescence, moreover, it is particularly easy to detect light emission from the scintillator by the photodetector.

MODE FOR CARRYING OUT THE INVENTION

Figure 1:
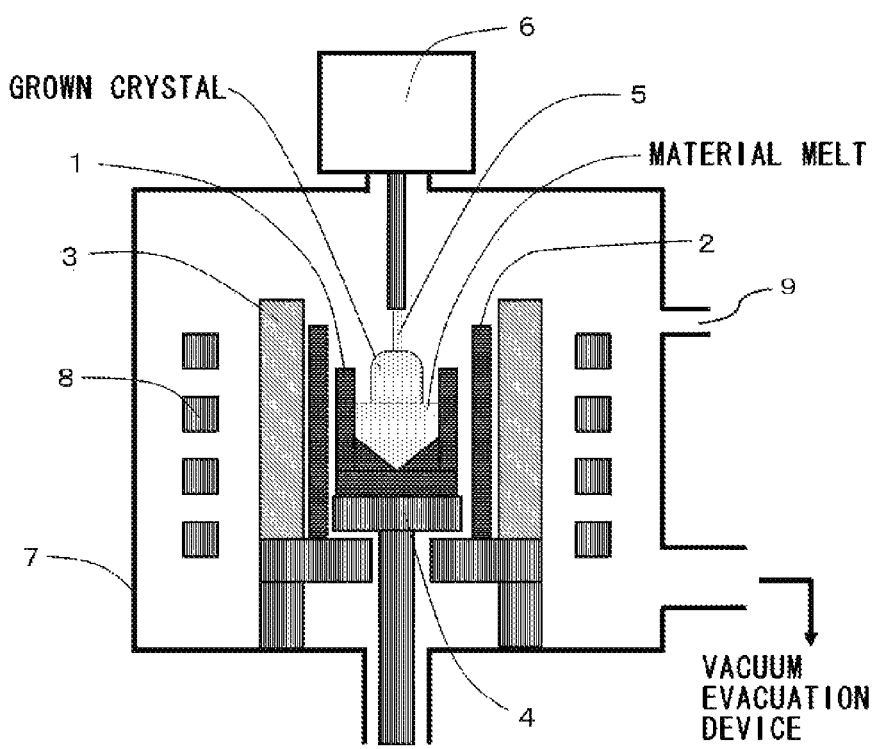
FIG. 1 is a schematic view of a manufacturing apparatus by the Czochralski method which is used for preparing the colquiriite-type crystal of the present invention.

The colquiriite-type crystal of the present invention comprises a metal halide represented by the chemical formula $LiM^1M^2X_6$ where $M^1$ represents at least one alkaline earth metal element selected from the group consisting of Mg, Ca, Sr and Ba, $M^2$ represents at least one metal element selected from the group consisting of Al, Ga and Sc, and X represents at least one halogen element selected from the group consisting of F, Cl, Br and I.

The colquiriite-type crystal is a hexagonal crystal belonging to the space group P31c, and can be easily identified by the technique of powder X-ray diffraction.

Of the colquiriite-type crystals, the colquiriite-type crystal in which the halogen elements are F is the most preferred one, because it lacks deliquescent properties and has excellent chemical stability. In the colquiriite-type crystal having F as the halogen elements, some of the F's may be substituted by Cl, Br or I in order to improve the properties of the scintillator, such as the amount of luminescence.

Of the colquiriite-type crystal having F as the halogen elements, the colquiriite-type crystal represented by the chemical formula $LiCa_{1-x}Sr_xAlF_6$ where x denotes 0 to 1 is preferred, because it facilitates the preparation of a large crystal, and can increase the amount of luminescence when used as a scintillator. Moreover, $LiCaAlF_6$ of the above-mentioned chemical formula where x is 0 is the most preferred, because it has a small effective atomic number and can lower the sensitivity to γ rays. In the present invention, the effective atomic number is an indicator defined by the following equation:

$$\text{Effective atomic number} = (\Sigma W_i Z_i^4)^{1/4}$$

where $W_i$ and $Z_i$, respectively, represent the mass fraction and the atomic number of the ith element among the elements constituting the scintillator.

The colquiriite-type crystal of the present invention is characterized in that the isotopic ratio of $^6Li$ is 20% or more. The isotopic ratio of $^6Li$ refers to the proportion of $^6Li$ isotope in all lithium elements, and affects the detection efficiency for neutron. That is, neutrons incident on the colquiriite-type crystal are detected by their nuclear reaction with the $^6Li$ isotope. Thus, the higher the isotopic ratio of $^6Li$, the better the detection efficiency for neutron becomes when the colquiriite-type crystal is used as a scintillator for neutron detection. The increase in the detection efficiency enables the incident neutron to be detected without fail. Hence, such a scintillator for neutron detection can be used particularly preferably in applications requiring high sensitivity.

By setting the isotopic ratio of $^6Li$ at 20% or more, the detection efficiency of the resulting colquiriite-type crystal for neutron can be increased sufficiently. In order to enhance the detection efficiency further, the isotopic ratio of $^6Li$ is set preferably at 50% or more, and most preferably at 90% or more.

The isotopic ratio of $^6Li$ can be adjusted, as appropriate, by adjusting the isotopic ratio of $^6Li$ contained in a lithium halide (will hereinafter be referred to as LiX), such as LiF, used as a starting material.

With naturally occurring Li, the isotopic ratio of $^6Li$ is merely about 7.6%. However, materials in which $^6Li$ isotope is enriched to raise the isotopic ratio of $^6Li$ are commercially available, and can be easily procured.

In the present invention, examples of the method for adjusting the isotopic ratio of $^6Li$ are a method using a material having the $^6Li$ isotope enriched to the intended isotopic ratio of $^6Li$, and a method which comprises making ready for use a material having $^6Li$ enriched beforehand to the intended $^6Li$-isotopic ratio or higher, and mixing the enriched material and a general-purpose material having the natural isotopic ratio to adjust the isotopic ratio.

The colquiriite-type crystal of the present invention is characterized by containing at least one lanthanoid element selected from among Ce, Pr and Nd. This lanthanoid element acts as an activator which emits light when neutrons are incident thereon. The above-mentioned Ce, Pr and Nd all exhibit light emission due to electron transition from the 5d level to the 4f level. Since such light emission has a short fluorescence lifetime, a scintillator with an excellent fast response can be obtained.

Of the above lanthanoid elements, Ce provides a high amount of luminescence, and is thus preferred. In the present invention, the amount of luminescence refers to the number of photons of scintillation light generated by the incidence of radiation. It is expressed as the number of photons per incident neutron (photons/neutron) for neutron, and is expressed as the number of photons per energy of incident γ rays (photons/MeV) in connection with γ rays.

The content of the lanthanoid element is preferably 0.01 to 0.5 mol % based on the colquiriite-type crystal. By setting the content at 0.01 mol % or more, a colquiriite-type crystal satisfactory in the properties of the scintillator can be obtained. The content of 0.5 mol % or less makes it possible to avoid problems with the production of the crystal, such as cloudiness of the crystal. The content of the lanthanoid, as will be described later, can be adjusted, as appropriate, by the mixing ratio of a halide of the lanthanoid element to be added to a material mixture in the production of the colquiriite-type crystal.

The colquiriite-type crystal of the present invention is characterized most by containing at least one alkali metal element selected from among Na, K, Rb and Cs. By incorporating the alkali metal element, not only the amount of luminescence by the colquiriite-type crystal used as the scintillator is increased, but the ability to discrimination between neutron and γ rays is also enhanced.

Generally, when the amount of luminescence by the incidence of neutrons increases, the amount of luminescence by the incidence of γ rays also increases. The colquiriite-type crystal of the present invention, on the other hand, increases in the amount of luminescence by the incidence of neutrons as a result of incorporation therein of the alkali metal element, but does not increase in the amount of luminescence by the incidence of γ rays. Thus, the difference between the amounts of luminescence upon the incidence of neutrons and the incidence of γ rays is very great. If such a difference in the amount of luminescence is utilized, it becomes easy to discriminate between neutron and γ rays by providing a threshold for the pulse height value of luminescence pulses produced by the scintillator, and handling only luminescence pulses exceeding the threshold value as signals attributed to the incidence of neutron.

The colquiriite-type crystal of the present invention specifically shows the ability to discriminate between neutron and γ rays as stated above, but its mechanism of action remains to be clarified.

Of the alkali metal elements, Na is the most preferred element. That is, Na has a small atomic number, and thus its probability for interaction with γ rays is low. Moreover, the use of Na can result in the provision of a deliquescence-free colquiriite-type crystal. Hence, Na is preferred.

The content of the alkali metal element is preferably 0.001 to 10 mol %, particularly preferably 0.01 to 0.5 mol %, with respect to the colquiriite-type crystal, for the same reasons as those for the lanthanoid element. The content of the alkali metal element, as will be described later, can be adjusted, as appropriate, by the mixing ratio of the halide of the alkali metal element to be added to the material mixture in the production of the colquiriite-type crystal.

The colquiriite-type crystal of the present invention may be in any of a single crystal form and a polycrystalline form. However, a single crystal is preferred in order to obtain a neutron scintillator with a high amount of luminescence, without involving a loss due to nonradiative transition attributed to a lattice defect or the dissipation of scintillation light at the grain boundary.

The colquiriite-type crystal of the present invention is a colorless or slightly colored transparent crystal, and is highly pervious to scintillation light. This crystal also has satisfactory chemical stability and, when it is used in an ordinary manner, its performance does not deteriorate over a short term. Furthermore, its mechanical strength and processability are satisfactory, and it can be easily processed into a desired shape and used.

The method of producing the colquiriite-type crystal of the present invention is not limited, and this crystal can be produced by a publicly known crystal manufacturing method. Preferably, the crystal is produced by the Czochralski method or the micro-pulling-down method. A colquiriite-type crystal excellent in quality, such as transparency, can be produced by adopting the Czochralski method or the micro-pulling-down method. According to the micro-pulling-down method, the crystal can be directly produced in a specific shape, and can be produced in a short time. According to the Czochralski method, on the other hand, a large crystal several inches in diameter can be produced at a low cost.

An explanation will be offered for a general method in producing the colquiriite-type crystal by the Czochralski method.

First, predetermined amounts of materials are charged into a crucible 1. The purity of the materials is not limited, but is preferably 99.99% or higher. By using such high-purity materials, the purity of the resulting crystal can be increased, so that the characteristics such as the amount of luminescence are improved. The materials used may be powdery or particulate materials, or may be used after being sintered or melt-solidified beforehand.

As the materials, according to the intended colquiriite-type crystal, there is used a material mixture formed by mixing, as appropriate, halides of the alkaline earth metals (for example, $MgF_2$, $CaF_2$, $SrF_2$ and $BaF_2$), halides of the metal elements (for example, $AlF_3$, $GaF_3$ and $ScF_3$), halides of the alkali metal elements (for example, NaF, KF, RbF and CsF), and halides of the lanthanoid elements (for example, $CeF_3$, $PrF_3$ and $NdF_3$).

The mixing ratio of LiX, the halide of the alkaline earth metal, and the halide of the metal element in the material mixture is adjusted to a molar ratio of 1:1:1. In producing the colquiriite-type crystal by the melt growth method such as the Czochralski method or the micro-pulling-down method, however, the LiX and the halide of the metal element may each be used about 1 to 10% in excess of the above ratio, because they are easily volatile. Their volatilization volumes are entirely different according to the manufacturing conditions (temperature, atmosphere, process) for the crystal. Thus, it is desirable to investigate the volatilization volumes of the LiX and the halide of the metal element beforehand, and determine the mixing ratio of the materials.

The amounts of the alkali metal element and the lanthanoid element incorporated in the colquiriite-type crystal can be adjusted, as appropriate, by the mixing ratio of the halide of the alkali metal element and the halide of the lanthanoid element added to the material mixture.

The amount of the alkali metal added is preferably 0.001 to 10 mol %, further preferably 0.01 to 5 mol %, with respect to the colquiriite-type crystal in consideration of a change in the amount of the alkali metal element contained in the crystal due to segregation.

The amount of the lanthanoid element added is preferably 0.01 to 0.5 mol % with respect to the colquiriite-type crystal.

Then, the crucible 1 charged with the materials, a heater 2, a heat insulator 3, and a movable stage 4 are installed as shown in FIG. 1. Another crucible with a hole provided at the bottom may be mounted on the crucible 1 and suspended by being fixed to the heater 2 or the like, whereby a double crucible structure may be constructed.

A seed crystal 5 is mounted on the front end of an automatic diameter control device 6. A metal, such as platinum, excellent in corrosion resistance at a high temperature may be used instead of the seed crystal. However, the use of a single crystal having a crystal structure identical to or similar to that of the colquiriite-type crystal to be produced is preferred, because the cracking of the crystal can be avoided.

The automatic diameter control device is composed of a load cell for measuring the weight of the crystal, and a circuit system for feeding the measured weight back to a heater output. By using this automatic diameter control device, a crystal with the intended diameter can be produced stably with high accuracy.

Then, using a vacuum evacuator, the interior of a chamber 7 is evacuated to $1.0 \times 10^{-3}$ Pa or lower. Then, an inert gas such as high purity argon is introduced into the chamber for gas exchange. The pressure within the chamber after the gas exchange is not limited, but is generally atmospheric pressure. By this gas exchange operation, water adhering to the starting materials or the interior of the chamber can be removed, and the deterioration of the crystal due to such water can be prevented.

To avoid adverse influence due to water which cannot be removed even by the above gas exchange operation, it is preferred to use a scavenger highly reactive with water. As such a scavenger, tetrafluoromethane or the like can be used preferably. The scavenger is mixed with the above-mentioned inert gas, and the mixture is introduced into the chamber.

After the gas exchange operation is performed, the materials are heated by a high frequency coil 8 and the heater 2 until they are melted. The method of heating is not limited, and a resistance heating method using a carbon heater or the like, for example, can be used, as appropriate, in place of the induction heating method using the high frequency coil and the heater.

Then, the molten material melt is brought into contact with the seed crystal. The output of the heater is adjusted such that a portion of the melt in contact with the seed crystal is brought to a solidification temperature. Then, under control by the automatic diameter control device 6, the resulting crystal is pulled upward, with the pull rate being automatically adjusted. The movable stage 4 may be moved upward or downward, as appropriate, in order to adjust the height of the liquid level. The crystal is continuously pulled up, with the output of the high frequency coil being adjusted where appropriate. When the crystal grows to the desired length, the crystal is cut off the liquid surface, and cooled over the course of a sufficient time so as to avoid cracking of the crystal. As a result, colquiriite-type crystal can be obtained.

Annealing may be performed for the produced crystal, for the purpose of eliminating a crystal defect due to a deficiency in the fluorine atoms or thermal strain.

The resulting colquiriite-type crystal has satisfactory processability, and can be processed into a desired shape for use as a scintillator for neutron detection. In processing the colquiriite-type crystal, a cutter such as a blade saw or a wire saw, a grinder or an abrasive wheel, which is publicly known, can be used without limitation.

The shape of the scintillator for neutron detection according to the present invention is not limited. Preferably, however, this scintillator has an optical output surface opposing a photodetector to be described later, and the optical output surface has been optically polished. By having such an optical output surface, the scintillator can enter light generated thereby into the photodetector efficiently.

The shape of the optical output surface is not limited, and a shape adapted for applications can be appropriately selected and used, such as a quadrilateral shape measuring several millimeters to several hundred millimeters per side, or a circular shape with a diameter of several millimeters to several hundred millimeters.

The thickness of the scintillator in the direction of incidence of neutron differs according to the energy of neutron to be detected, but is generally several hundred micrometers to several hundred millimeters.

Preferably, a light reflection film comprising aluminum or Teflon (registered trademark) is applied to a surface of the scintillator which does not oppose the photodetector. By so doing, dissipation of light generated by the scintillator can be prevented.

The scintillator for neutron detection according to the present invention is combined with a photodetector, whereby a neutron detector can be constituted. That is, light emitted from the scintillator for neutron detection upon irradiation with neutron is converted into an electrical signal by the photodetector, whereby the presence or absence and strength of neutron can be grasped as the electrical signal. In the present invention, the photodetector is not limited, and a publicly known photodetector such as a photomultiplier tube or a photodiode can be used without limitation.

The method of manufacturing a neutron detector by combining the scintillator for neutron detection according to the present invention with a photodetector is not limited. For example, the optical output surface of the scintillator for neutron detection is bonded to an optical detection surface of the photodetector with the use of an optical grease or the like, and a power supply and a signal readout circuit are connected to the photodetector, whereby a neutron detector can be produced. The signal readout circuit is generally composed of a preamplifier, a shaping amplifier, a multichannel pulse height analyzer, and an oscilloscope.

Furthermore, a multiplicity of the scintillators each coated with the aforementioned light reflection film are arrayed, and a position-sensitive photodetector is used as the photodetector, whereby the neutron detector can carry out position resolution.

EXAMPLES

Hereinbelow, the present invention will be described concretely by reference to its Examples, but the present invention is in no way limited by these Examples. Moreover, not all of combinations of the features described in the Examples are essential to the means for solution to the problems that the present invention adopts.

Example 1

Production of Colquiriite-Type Crystal and Manufacture of Scintillator for Neutron Detection A colquiriite-type crystal represented by the chemical formula $LiCaAlF_6$ and containing Na and Ce as an alkali metal element and a lanthanoid element, respectively, was prepared. The isotopic ratio of $^6Li$ was set at 95%.

The above-mentioned colquiriite-type crystal was produced using a crystal production apparatus by the Czochralski method shown in FIG. 1. High purity fluoride powders of $LiF$, $CaF_2$, $AlF_3$, $NaF$ and $CeF_3$, each having purity of 99.99% or higher, were used as raw materials. As the LiF, a commercially available product with a $^6Li$-isotopic ratio of 95% was used. The crucible 1, the heater 2, and the heat insulator 3 used were formed of high purity carbon.

First, LiF, CaF$_2$, AlF$_3$, NaF and CeF$_3$ were weighed such that their mixing ratio (molar ratio) was 1.01:1:1.03:0.02: 0.02, respectively, and they were mixed thoroughly to prepare a material mixture. The total weight of the resulting material mixture was 3 kg. The material mixture was charged into the crucible 1, and the charged crucible 1 was installed on the movable stage 4, whereafter the heater 2 and the heat insulator 3 were sequentially installed around the crucible 1. Then, a LiCaAlF$_6$ single crystal, which had been processed into the form of a rectangular parallelepiped measuring 6×6×30 mm$^3$, was used as the seed crystal 5, and mounted on the front end of the automatic diameter control device.

The interior of the chamber 6 was evacuated under vacuum to $5.0 \times 10^{-4}$ Pa by use of a vacuum evacuation device composed of an oil-sealed rotary vacuum pump and an oil diffusion pump. Then, a tetrafluoromethane-argon mixed gas was introduced into the chamber 7 up to atmospheric pressure for gas exchange.

A high frequency current was applied to the high frequency coil 8 to heat the materials by induction heating, thereby melting them. The seed crystal 5 was moved until a 6×6 mm$^2$ surface of the seed crystal 5 was brought into contact with the liquid surface of the material melt. The output of the heater was adjusted such that a portion of the melt in contact with the seed crystal came to a solidification temperature. Then, under control by the automatic diameter control device 6, the diameter of the resulting crystal was gradually increased up to 55 mm, whereafter the crystal was pulled upward, with the diameter being kept at a constant value of 55 mm.

During crystal growth, the movable stage 4 was moved, as appropriate, in order to adjust the liquid level to a constant position, and the crystal was continuously pulled up, with the output of the high frequency coil being adjusted where appropriate. When the crystal grew to a length of about 80 mm, the crystal was cut off the liquid surface, and cooled over about 48 hours to obtain a single crystal with a diameter of 55 mm and a length of about 80 mm.

A part of the single crystal was pulverized, and the resulting powder was subjected to X-ray diffraction measurement. The single crystal was found to be a LiCaAlF$_6$ single crystal, one of colquiriite-type crystals.

Then, a part of the single crystal was used to prepare a disk-shaped sample 1 mm thick and optically polished at both surfaces. The sample was subjected to measurement by SEM-EDS, which showed the detection of Na. The absorption spectrum of the sample was also measured, showing a characteristic absorption attributed to Ce in a wavelength region at about 270 nm. The contents of various ions in the crystal were investigated by ICP analysis, whereby it was found that the content of Ce in the crystal was 0.074 mol %, and the content of Na was 0.85 mol %.

Based on these findings, the single crystal produced in the present Example was a colquiriite-type crystal represented by the chemical formula LiCaAlF$_6$, containing Na and Ce, and having an isotopic ratio of $^6$Li of 95%.

The resulting colquiriite-type crystal was cut by a wire saw equipped with a diamond wire. Then, all surfaces of the crystal were ground with an abrasive wheel and optically polished to be processed into a shape measuring 10×10×4 mm$^3$. In this manner, the scintillator for neutron detection according to the present invention was obtained.

[Manufacture of Neutron Detector]

First, a 10×10 mm$^2$ surface of the scintillator for neutron detection was used as an optical output surface, and a tape-shaped Teflon (registered trademark) was wrapped around surfaces of the scintillator other than the optical output surface to form a light reflection film. Then, a photomultiplier tube (R7600U produced by HAMAMATSU PHOTONICS K.K.) was rendered ready for use as a photodetector, and the optical output surface of the scintillator was bonded to an optical detection surface of the photomultiplier tube with the use of an optical grease.

A power supply and a signal readout circuit were connected to the photomultiplier tube to manufacture a neutron detector. As the signal readout circuit, a preamplifier, a shaping amplifier, and a multichannel pulse height analyzer were connected from the photomultiplier tube side.

[Characteristics Evaluation of Neutron Detector]

The neutron detector was covered with a black sheet for light shielding. Then, the scintillator was irradiated with neutron from a $^{252}$Cf sealed radiation source with radioactivity of about 1 MBq, the neutron being slowed down via a polyethylene block having a thickness of 40 mm.

Using the power supply connected to the photomultiplier tube, a high voltage of 650V was applied to the photomultiplier tube. Luminescence pulses produced by the scintillator upon entry of neutrons were converted into pulsed electrical signals by the photomultiplier tube. The electrical signals were entered into the multichannel pulse height analyzer via the preamplifier and the shaping amplifier. The electrical signals entered into the multichannel pulse height analyzer were analyzed to prepare a pulse height spectrum. Then, a pulse height spectrum was prepared in the same manner as described above, except that the scintillator was irradiated with gamma rays from a $^{60}$Co sealed radiation source with radioactivity of about 1 KBq, instead of the neutron.

Figure 2:
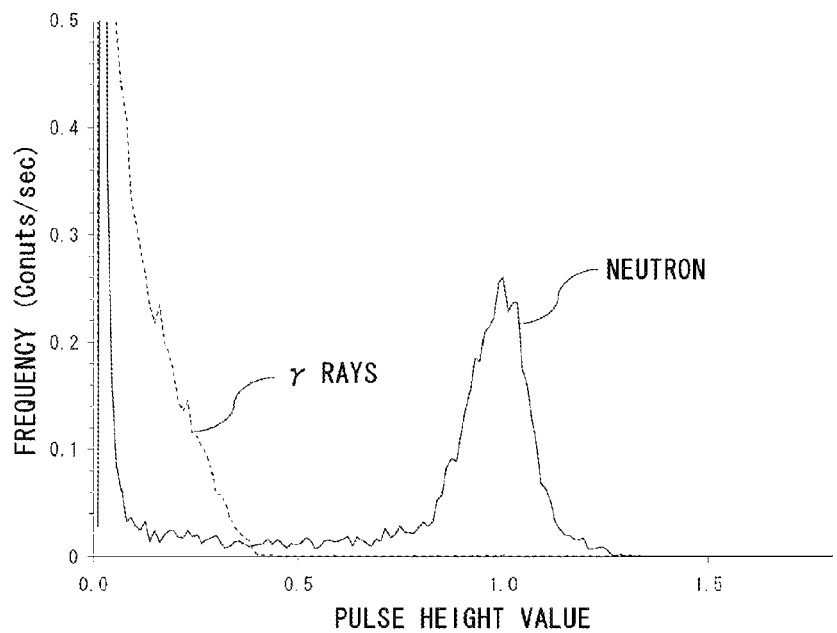
FIG. 2 is a view of pulse height spectra obtained when a scintillator for neutron detection of Example 1 was irradiated with neutron and γ rays.

The resulting pulse height spectra are shown in FIG. 2. The solid line and the dotted line in FIG. 2 represent the pulse height spectra under irradiation with neutron and γ rays, respectively. The abscissa of the pulse height spectrum represents the pulse height value of the pulsed electrical signal, namely, the amount of luminescence from the scintillator. Here, the pulse height value was expressed as a relative value with respect to the pulse height value of the peak of the pulse height spectrum under irradiation with neutron being taken as 1. The ordinate represents the frequency of the electrical signal showing each pulse height value. The frequency was expressed as the frequency (counts/sec) with which the electrical signal concerned was measured.

Clear peaks formed as a result of detection of neutron were confirmed from FIG. 2, showing that the system of the present Example acted as a neutron detector. The pulse height value of the electrical signal produced by the incidence of γ rays was much lower than the pulse height value of the electrical signal produced by the incidence of neutron. This is proof that the detector of the present Example can easily discriminate between γ rays and neutron.

Comparative Example 1

A colquiriite-type crystal represented by the chemical formula LiCaAlF$_6$ and containing no alkali metal element, but containing Ce as a lanthanoid element was produced. The isotopic ratio of $^6$Li was set at 95%.

A single crystal was obtained in the same manner as in Example 1, except that NaF was not added to the material mixture. The resulting single crystal was subjected to the same measurements as those in Example 1. The single crystal produced in the present Comparative Example was found to be a colquiriite-type crystal represented by the chemical formula LiCaAlF$_6$, containing Ce, and having an isotopic ratio of $^6$Li of 95%.

In the same manner as in Example 1, the resulting single crystal was processed to form a scintillator, and then a neutron detector was manufactured. Using the resulting neutron detector, pulse height spectra under irradiation with neutron and irradiation with γ rays were prepared.

Figure 3:
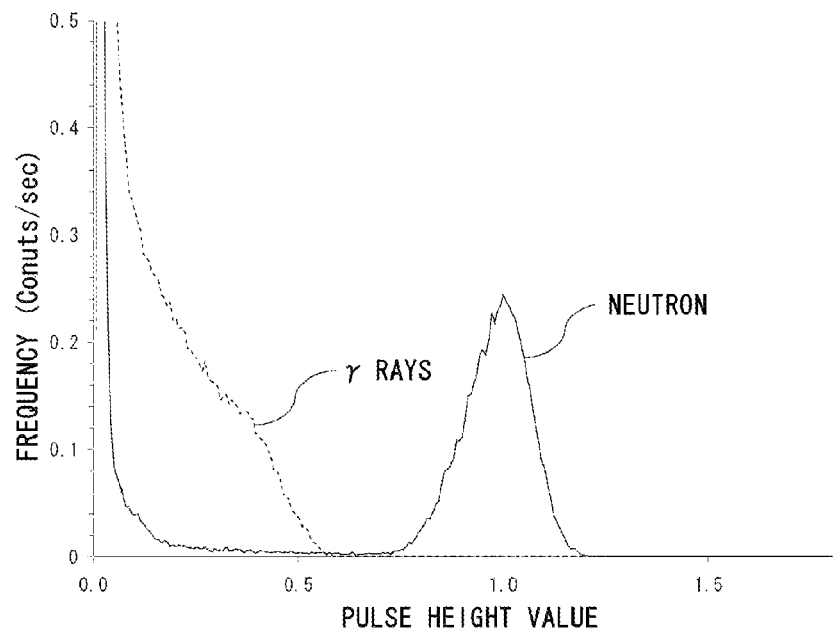
FIG. 3 is a view of pulse height spectra obtained when a scintillator for neutron detection of Comparative Example 1 was irradiated with neutron and γ rays.

The resulting pulse height spectra are shown in FIG. 3. The solid line and the dotted line in FIG. 3 represent the pulse height spectra under irradiation with neutron and γ rays, respectively. The abscissa and the ordinate have the same meanings as in FIG. 2.

Clear peaks attributed to neutron were confirmed from FIG. 3, showing that the system of the present Comparative Example acted as a neutron detector. However, the pulse height values resulting from γ rays were lower than the pulse height values attributed to neutron, but their maximum value reached about 0.6 relative to the neutron-associated pulse height values. With the neutron detector of Example 1, on the other hand, the maximum pulse height value upon γ ray irradiation remained at about 0.4. Thus, the neutron detector of the present Comparative Example was inferior in the ability to discriminate between neutron and γ rays.

Figure 4:
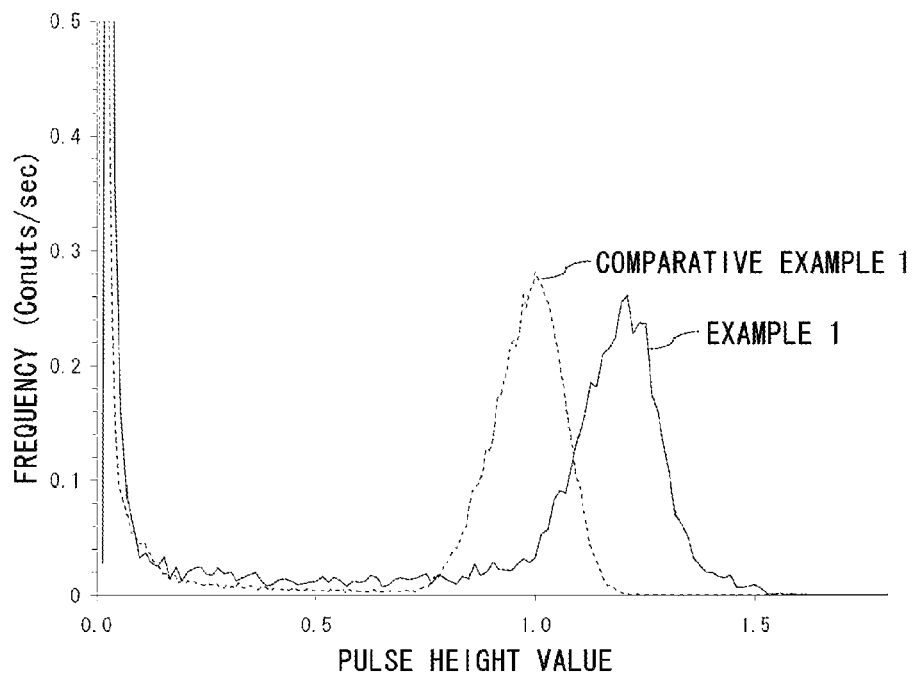
FIG. 4 is a view of the pulse height spectra obtained when the scintillators for neutron detection of Example 1 and Comparative Example 1 were irradiated with neutron.

FIG. 4 shows the pulse height spectra obtained by the scintillators for neutron detection of Example 1 and Comparative Example 1 upon irradiation with neutron. Here, the pulse height values were expressed as relative values with respect to the peak value of the pulse height spectrum obtained by the neutron detection scintillator of Comparative Example 1 taken as 1. FIG. 4 reveals that in comparison with the conventional scintillator for neutron detection, the scintillator for neutron detection of Example 1 provided the amount of luminescence upon incidence of neutron which reached about 1.2 times as great. Thus, the scintillator for neutron detection according to the present invention was shown to be also superior in the amount of luminescence.

The foregoing explanations prove that the scintillator for neutron detection comprising the colquiriite-crystal according to the present invention is excellent in the ability to discriminate between neutron and γ rays and in the amount of luminescence when neutron is incident. Moreover, the neutron detector using this scintillator for neutron detection is shown to be effective.

Example 2

Figure 5:
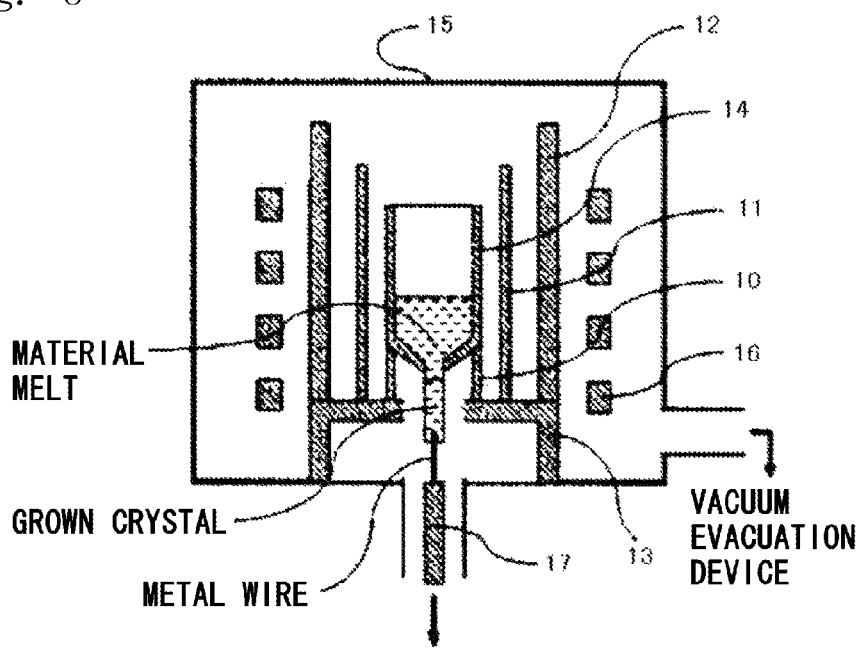
FIG. 5 is a schematic view of a manufacturing apparatus by the micro-pulling-down method which is used for preparing the colquiriite-type crystal of the present invention.

A crystal of $LiCaAlF_6$ containing Ce and Na was produced using a manufacturing apparatus as shown in FIG. 5. Lithium fluoride ($^6Li$ isotopic ratio 950), calcium fluoride, aluminum fluoride, cerium fluoride and sodium fluoride, each having purity of 99.99%, were used as materials. An after-heater 10, a heater 11, a heat insulator 12, a stage 13, and a crucible 14 used were made of high purity carbon, and the shape of a hole provided in the bottom of the crucible was a cylindrical shape 2.0 mm in diameter and 0.5 mm in length.

First, 0.53 g of lithium fluoride, 1.66 g of calcium fluoride, 1.87 g of aluminum fluoride, 84 mg of cerium fluoride, and 18 mg of sodium fluoride were weighed, and thoroughly mixed, followed by charging the mixture into the crucible 14. The crucible 14 charged with the materials was mounted above the after-heater 10, and the heater 11 and the heat insulator 12 were sequentially installed around them.

Then, the interior of the chamber 15 was evacuated to $5.0 \times 10^{-4}$ Pa by a vacuum evacuator comprising an oil-sealed rotary vacuum pump and an oil diffusion pump. Simultaneously, heating was carried out using a high frequency coil 16 so that the temperature inside the crucible during evacuation would reach 570K.

A 95 vol. % argon-5 vol. % tetrafluoromethane gas mixture was introduced into the chamber 15 and, using the high frequency coil 16, the output of the high frequency heating coil was adjusted such that the heating temperature became 790K, with the temperature at the bottom of the crucible being measured. The pressure within the chamber 15 after a mixed gas exchange was set at atmospheric pressure and, in this state, heating was continued for 30 minutes. Then, with the heating by the high frequency heating coil being continued, evacuation was performed, and an argon gas was introduced into the chamber 15 for gas exchange. The pressure within the chamber 15 after the argon gas exchange was atmospheric pressure. The same procedure was performed twice.

Using the high frequency heating coil 16, the materials were heated to the melting point of $LiCaAlF_6$ until they were melted. Then, the high frequency output was adjusted to raise the temperature of the material melt gradually. During this process, a metal wire comprising a W—Re alloy, which was provided at the leading end of a pulling-down rod 17, was inserted into the hole in the bottom of the crucible 14, and pulled down. This procedure was repeated to withdraw the material melt through the hole. The high frequency output was fixed so that the temperature at this time was maintained, and the melt of the materials was pulled down to start the growth of a crystal. The melt was pulled down continuously for 14 hours at a rate of 1 mm/hr, whereby a single crystal of $LiCaAlF_6$ containing Ce and Na and measuring 2.1 mm in diameter and 40 mm in length was finally obtained.

ICP analysis was conducted to investigate the contents of various ions in the crystal, showing that the Ce content was 0.082 mol % and the Na content was 0.91 mol % in the crystal.

In the same manner as in Example 1, the resulting single crystal was processed to form a scintillator, and then a neutron detector was manufactured. Using the resulting neutron detector, pulse height spectra under irradiation with neutron and irradiation with γ rays were prepared.

Figure 6:
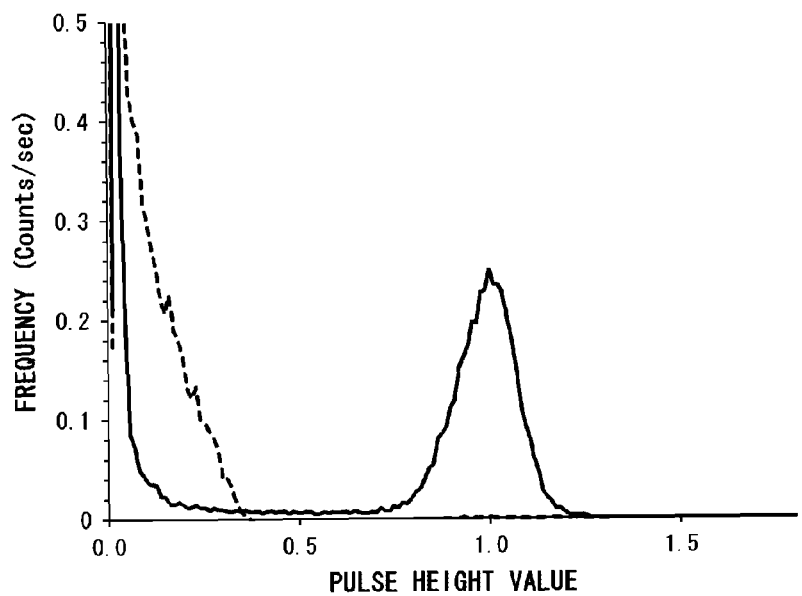
FIG. 6 is a view of pulse height spectra obtained when a scintillator for neutron detection of Example 2 was irradiated with neutron and γ rays.

The resulting pulse height spectra are shown in FIG. 6. The solid line and the dotted line in FIG. 6 represent the pulse height spectra under irradiation with neutron and γ rays, respectively. The abscissa and the ordinate have the same meanings as in FIG. 2.

Clear peaks attributed to neutron were confirmed from FIG. 6, showing that the system of the present Example acted as a neutron detector, and was capable of easily discriminating between γ rays and neutron.

Example 3

Crystal growth was performed in the same manner as in Example 1, except that 0.53 g of lithium fluoride, 1.66 g of calcium fluoride, 1.88 g of aluminum fluoride, 84 mg of cerium fluoride, and 2.7 mg of sodium fluoride were used as starting materials. Finally, a crystal of $LiCaAlF_6$ containing Eu and measuring 2.1 mm in diameter and 40 mm in length was obtained.

ICP analysis was conducted to investigate the contents of various ions in the crystal, showing that the Ce content in the crystal was 0.081 mol % and the Na content was 0.27 mol %.

In the same manner as in Example 1, the resulting single crystal was processed to form a scintillator, and then a neutron detector was manufactured. Using the resulting neutron detector, pulse height spectra under irradiation with neutron and irradiation with γ rays were prepared.

Figure 7:
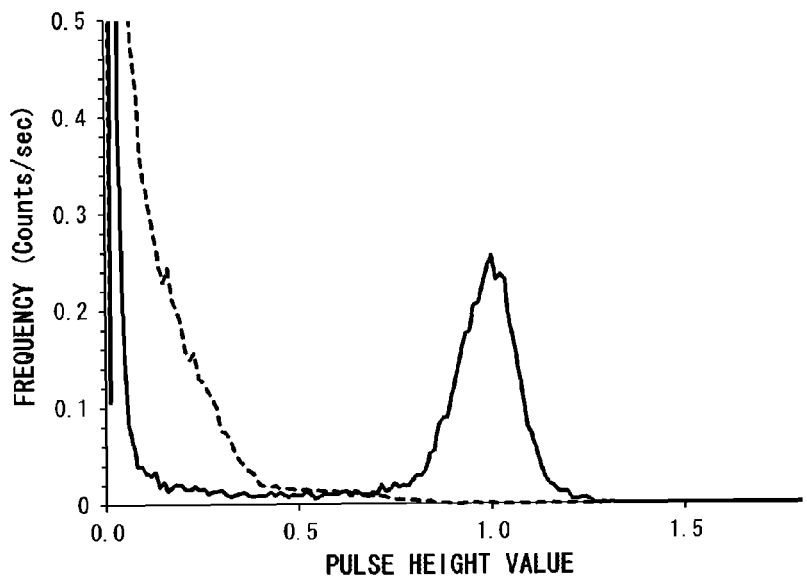
FIG. 7 is a view of pulse height spectra obtained when a scintillator for neutron detection of Example 3 was irradiated with neutron and γ rays.

The resulting pulse height spectra are shown in FIG. 7. The solid line and the dotted line in FIG. 7 represent the pulse height spectra under irradiation with neutron and γ rays, respectively. The abscissa and the ordinate have the same meanings as in FIG. 2.

Clear peaks attributed to neutron were confirmed from FIG. 7, showing that the system of the present Example acted as a neutron detector, and was capable of easily discriminating between γ rays and neutron.

EXPLANATIONS OF LETTERS OR NUMERALS

1 Crucible
2 Heater
3 Heat insulator
4 Movable stage
5 Seed crystal
6 Automatic diameter control device
7 Chamber
8 High frequency coil
9 Gas inlet
10 After-heater
11 Heater
12 Heat insulator
13 Stage
14 Crucible
15 Chamber
16 High frequency coil
17 Pulling-down rod

The invention claimed is:

1. A colquiriite-type crystal represented by the chemical formula $LiM^1M^2X_6$, wherein $M^1$ represents at least one alkaline earth metal element selected from the group consisting of Mg, Ca, Sr and Ba, $M^2$ represents at least one metal element selected from the group consisting of Al, Ga and Sc, and X represents at least one halogen element selected from the group consisting of F, Cl, Br and I,
wherein the colquiriite-type crystal contains at least one alkali metal element selected from the group consisting of Na, K, Rb and Cs, and at least one lanthanoid element selected from the group consisting of Ce, Pr and Nd, and an isotopic ratio of $^6Li$ is 20% or more; and
wherein contents of the alkali metal element and the lanthanoid element are 0.001 to 10 mol % and 0.01 to 0.5 mol %, respectively, with respect to the colquiriite-type crystal.

2. The colquiriite-type crystal according to claim 1, which is represented by the chemical formula $LiCa_{1-x}Sr_xAlF_6$ where x denotes a number of 0 to 1.

3. The colquiriite-type crystal according to claim 1, wherein $M^1$ is Ca, $M^2$ is Al, the alkali metal element is Na, the lanthanoid element is Ce, and the isotopic ratio of $^6Li$ is 50% or more.

4. A scintillator for neutron detection, comprising the colquiriite-type crystal according to claim 1.

5. A neutron detector comprising the scintillator for neutron detection according to claim 4, and a photodetector.

* * * * *